(12) United States Patent
Szu

(10) Patent No.: US 6,196,871 B1
(45) Date of Patent: Mar. 6, 2001

(54) METHOD FOR ADJUSTING DIFFERENTIAL THERMAL EXPANSION BETWEEN AN ELECTRICAL SOCKET AND A CIRCUIT BOARD

(75) Inventor: Ming-Lun Szu, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/299,334

(22) Filed: Apr. 26, 1999

(30) Foreign Application Priority Data

Feb. 2, 1999 (TW) ............................... 88101569

(51) Int. Cl.$^7$ .............................. H01R 13/73; H02B 1/01
(52) U.S. Cl. ................................. 439/571; 439/876
(58) Field of Search ................... 439/571, 525, 439/330, 572, 573, 876

(56) References Cited

U.S. PATENT DOCUMENTS

| | | | |
|---|---|---|---|
| 4,206,542 | * 6/1980 | Reavill | 28/877 |
| 4,774,760 | * 10/1988 | Seaman et al. | 29/840 |
| 4,836,792 | * 6/1989 | Glover | 439/81 |
| 4,873,397 | * 10/1989 | Masujima et al. | 174/117 |
| 5,046,953 | * 9/1991 | Shreeve et al. | 439/66 |
| 5,046,957 | * 9/1991 | Millhimes | 439/83 |
| 5,417,577 | * 5/1995 | Holliday et al. | 439/91 |
| 5,462,454 | * 10/1995 | Kramer et al. | 439/571 |
| 5,492,479 | * 2/1996 | Ortega | 439/71 |
| 5,800,209 | * 9/1998 | Suzuki | 439/571 |
| 5,834,848 | * 11/1998 | Iwasaki | 257/778 |

\* cited by examiner

*Primary Examiner*—Khiem Nguyen
*Assistant Examiner*—Hae Moon Hyeon
(74) *Attorney, Agent, or Firm*—Wei Te Chung

(57) ABSTRACT

The present invention relates to a method for adjusting differential thermal expansion between an electrical socket and a circuit board by means of secure and accurate interconnection of an adjusting device therebetween before a heating step. The adjusting device is made of an adhesive fusible material and fixed to the housing for absorbing most of the fracture stress exerted on the solder balls and for eliminating a misalignment between the electrical socket and the circuit board during the heating step. The adjusting device can be designed according to practical requirements to be a number of adjusting posts, an adjusting frame, or an adjusting chip.

5 Claims, 6 Drawing Sheets

METHOD FOR ADJUSTING DIFFERENTIAL THERMAL EXPANSION BETWEEN AN ELECTRICAL SOCKET AND A CIRCUIT BOARD

BACKGROUND OF THE INVENTION

The present invention relates to a method for adjusting differential thermal expansion between an electrical socket and a circuit board having different coefficients of thermal expansion (CTE).

With the rapid development of electronic instruments, a variety of corresponding electrical components are successively developed to support the technological advances gained by the electronic instruments. For a modularized central processing unit (CPU) of a computer, an electrical socket is mounted on a circuit board to firmly assemble the CPU thereto. Such electrical connector is arranged with a number of conductive contacts in arrays. One end of each contact extends from one side of the socket for electrically contacting with corresponding conductive sections of the CPU, while the other end of each contact extends from the other side of the socket for electrically connecting with the circuit board.

Through hole technology is often employed for attaching an electrical socket to a circuit board. One end of each contact of the electrical socket extends into a corresponding through hole of the circuit board. However, the through holes of the circuit board should be arranged in arrays corresponding to the contacts of the electrical socket thereby occupying space on both sides of the circuit board. Such a procedure complicates manufacture of the circuit board and does not promote an efficient use of space thereon, especially when the arrangement of the contacts of the electrical socket is dense.

Therefore, a ball grid array (BGA) type modularized CPU package has been developed, which directly solders a number of solder balls to an electrical socket for electrical connection with a circuit board. The corresponding conductive contacts of the electrical socket each form two opposite ends for respectively engaging with the solder balls and disc-shaped contact pads formed on a surface of the circuit board. The solder balls are then heated to reach a melting point thereof whereby the contacts are soldered to the corresponding contact pads.

Due to new applications and configuration designation requirements, an insulative housing of the electrical socket and the circuit board should be constructed from different material with different coefficients of thermal expansion (CTE). The difference in CTE will result in different thermal expansions thereof which may create a fracture stress exerted on the solder balls attached to the contacts of the socket thereby misaligning some of the contacts of the socket with the corresponding contact pads of the circuit board during the heating process.

Thus, if the solder balls can not be properly deposited on the contact pads, the poor soldering quality and inadequate electrical reliability may result. In serious cases, a short circuit may be formed between the electrical socket and the circuit board. Furthermore, a significant fracture stress acting on the solder balls between the contacts of the socket and the contact pads of the circuit board may result in the contacts becoming disconnected from the socket.

BRIEF SUMMARY OF THE INVENTION

The main object of the present invention is to provide a method for adjusting differential thermal expansion between an electrical socket and a circuit board which are soldered together.

Another object of the present invention is to provide an adjusting device to reduce a fracture stress resulting from differential thermal expansion for preventing the misalignment of a plurality of solder balls attached between conductive contacts of a socket and contact pads of a circuit board.

In accordance with one aspect of the present invention, a method for adjusting differential thermal expansion includes the following steps: manufacturing, planting, adjusting and heat treating. In the adjusting step, an adjusting device is deposited between an electrical socket and a circuit board before the heat treating step for preventing misalignment of the conductive contacts of the electrical socket, and for reducing fracture stress due to the different thermal expansions.

In accordance with another aspect of the present invention, the adjusting device which is made of adhesive fusible material, such as thermoplastic or another suitable material which melts easily when properly heated, is viscidly adhered to an electrical socket and a circuit board thereby effectively eliminating the likelihood of misalignment of the solder balls for ensuring stable and reliable communication between the electrical socket and the circuit board.

Other objects, advantages and novel features of the invention will become more apparent from the following detailed description when taken in conjunction with the accompanying drawings.

DETAILED DESCRIPTION OF THE PRESENT INVENTION

Figure 1:
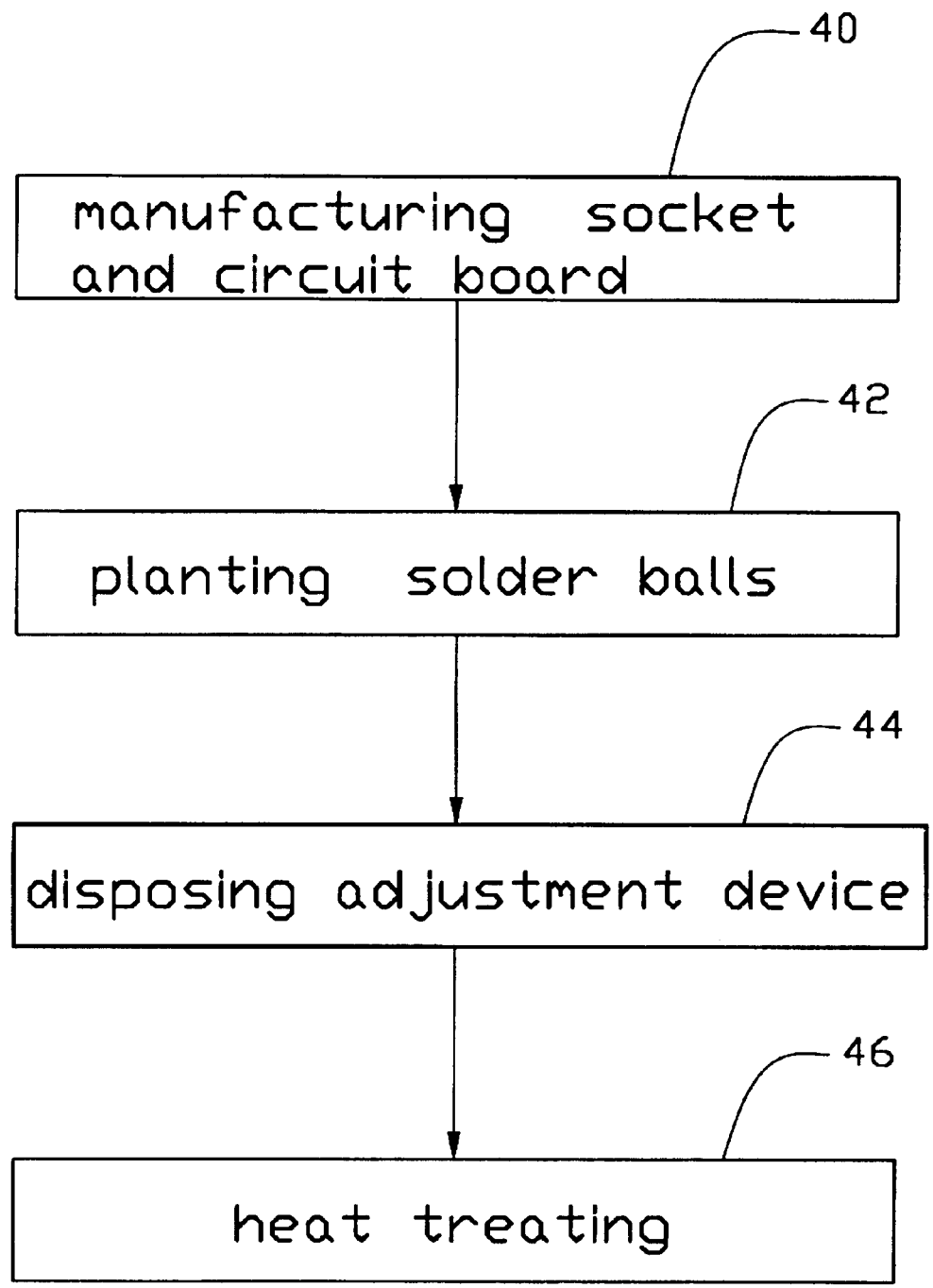
FIG. 1 is a flow chart of a method in accordance with the present invention.
Figure 2:
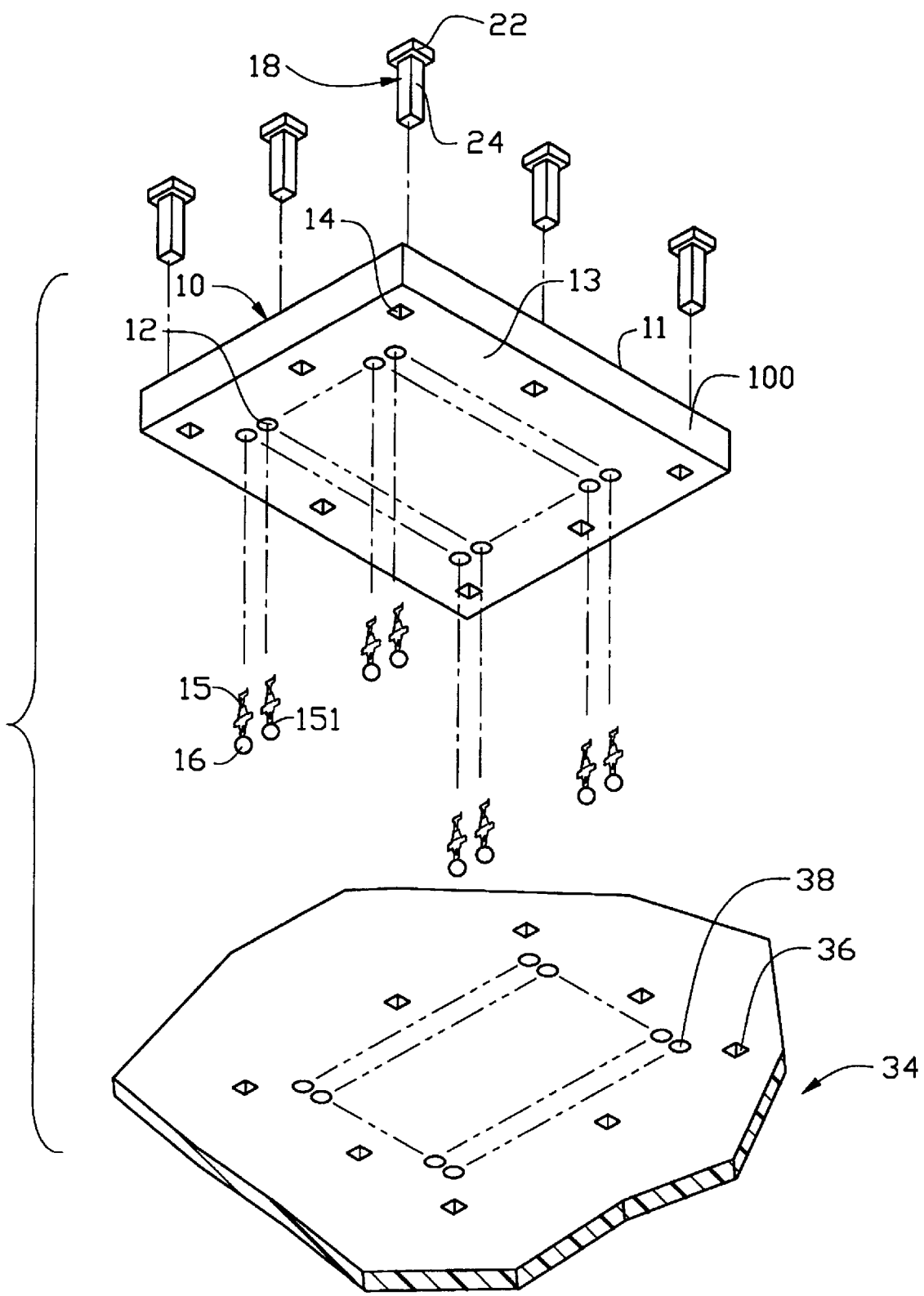
FIG. 2 is an exploded view of an electrical socket in accordance with a first embodiment of the present invention.

Referring to FIGS. 1 and 2, an electrical socket 10 is used to electrically connect a modular chip (not shown) to a circuit board 34. The method of the present invention can be performed according to the following steps.

Referring to FIGS. 1 and 2, in step 40, the electrical socket 10 and the circuit board 34 are manufactured according to practical requirements and design specifications. The electrical socket 10 comprises a plurality of contacts 15 and an insulative housing 100. The housing 100 forms a mating face 11 for abutting against the modular chip, a jointing face 13 opposite the mating face 11 and a plurality of engaging slots 12 defined between the mating face 11 and the jointing face 13 for receiving the corresponding contacts 15 therein. One end of each contact 15 extends beyond the mating face 11 for electrically contacting a corresponding conductive section of the modular chip. The other end of each contact 15 has a joining surface 151 proximate the jointing face 13 for attaching a solder ball 16 thereto. A plurality of holes 14 are positioned around the area defining the engaging slots 12. Each hole 14 has an aperture with a step-like configuration proximate the jointing face 13. The aperture is smaller than an opposite aperture proximate the mating face 11.

In the first embodiment, an adjusting device comprises a plurality of adjusting posts 18 made of an adhesive fusible material, such as thermoplastic, which melts easily after proper heating. Each adjusting post 18 comprises a base 22 and a leg 24. The leg 24 is inserted into the corresponding hole 14 from the mating face 11 of the housing 100 so that an end portion of the leg 24 projects beyond the jointing face 13 of the housing 100 and the base 22 is received within the hole 14. The circuit board 34 forms a plurality of contact pads 38 for electrical connection with the corresponding contacts 15 of the electrical socket 10. A plurality of positioning holes are defined in the circuit board 34 corresponding to the holes 14 of the housing 100 for receiving the legs 24 of the corresponding adjusting posts 18 therein. The positioning holes can be a half-through hole 361 as shown in FIGS. 3A and 3B, or a through hole 36 in accordance with second embodiment of the present invention as shown in FIGS. 4A and 4B.

Figure 3A:
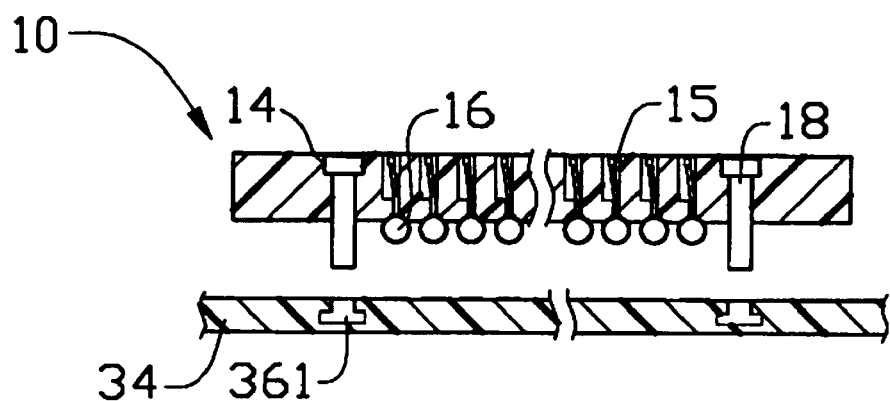
FIG. 3A is a cross sectional view of the first embodiment before soldering the electrical socket to the circuit board.
Figure 4A:
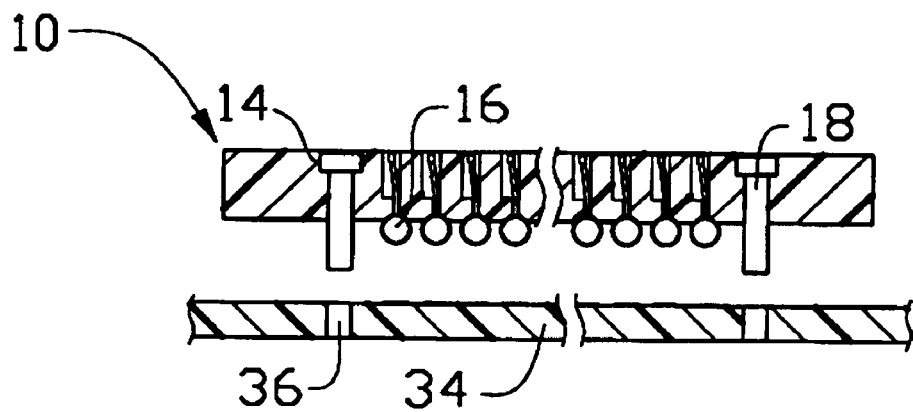
FIG. 4A is a cross sectional view of a second embodiment of an electrical socket before soldering the electrical socket to the circuit board.
Figure 4B:
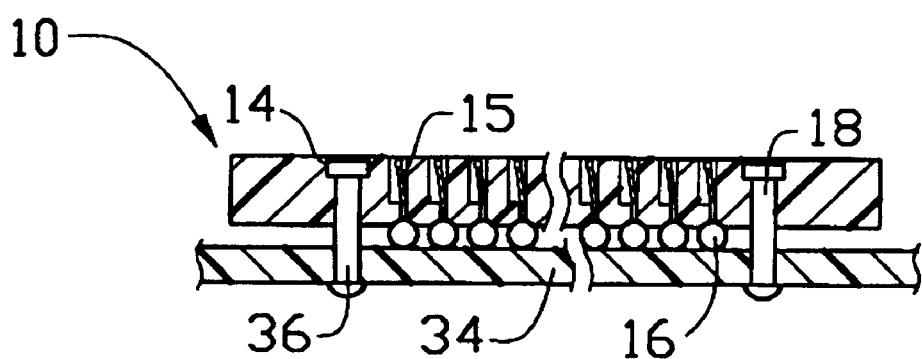
FIG. 4B is a cross sectional view of the second embodiment after soldering the electrical socket to the circuit board.

Referring to FIGS. 2 and 3A, in step 42 which involves planting the solder balls 16, a plurality of solder balls 16 are planted onto the joining surfaces 151 of the contacts 15 projecting beyond the jointing face 13 of the housing 100 when the solder balls 16 and the contacts 15 are properly heated. At the same time, the adjusting posts 18 are fixed into the corresponding holes 14 of the housing 100.

Referring to FIGS. 2 & 3A, in step 44 the connector 10 with the solder balls 16 planted thereon is appropriately positioned on the circuit board 34. The adjusting posts 18 are inserted into the corresponding half-through holes 361 of the circuit board 34 and the solder balls 16 abut against the contact pads 38 of the circuit board 34.

Figure 3B:
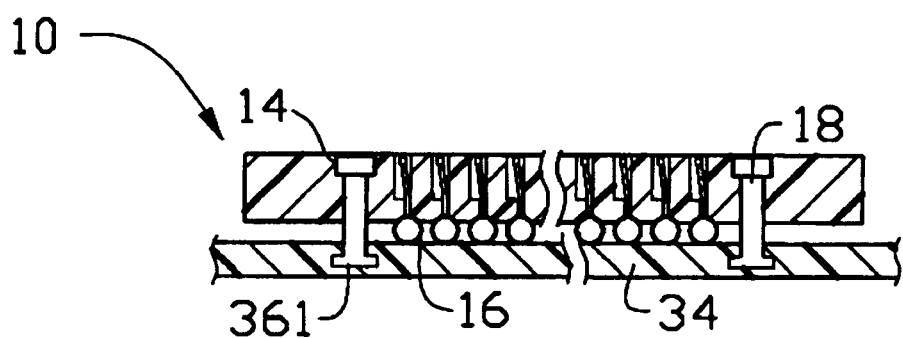
FIG. 3B is a cross sectional view of the first embodiment after soldering the electrical socket to the circuit board.

Referring to FIGS. 2 & 3B, in step 46 the connector 10 fixed on the circuit board 34 undergoes heat treatment process for firmly soldering the solder balls 16 of the connector 10 to the circuit board 34. During heat treatment, the solder balls 16 melt to attach to the corresponding contact pads 38 thereby soldering the contacts 15 onto the circuit board 34. The legs 24 of the adjusting posts 18 melt to flow into the half-through holes 361 and then solidify to fix the connector 10 to the circuit board 34.

It is noted that during the heat treatment process or any significant change of the surrounding temperature, the connector 10 and the circuit board 34 experience different thermal expansions and shrinkage due to different CTE thereof. However, since the adjusting posts 18 accurately fix the connector 10 to the circuit board 34 whereby the bases 22 are received in the corresponding holes 14 of the connector 10 and the legs 24 are firmly received in the corresponding half-through holes 361 of the circuit board, a fracture stress exerted on the solder balls 16 which may affect the deformation thereof can be greatly decreased. Likewise, the possibility of the misalignment between the contacts 15 and the contact pads 38 of the circuit board 34 is effectively eliminated.

Since the heat treatment procedure for the through holes 36 of the second embodiment shown in FIGS. 4A and 4B is essentially identical to the procedure for the half-through holes 361 of the first embodiment, a detailed description thereof is omitted herein.

Figure 5:
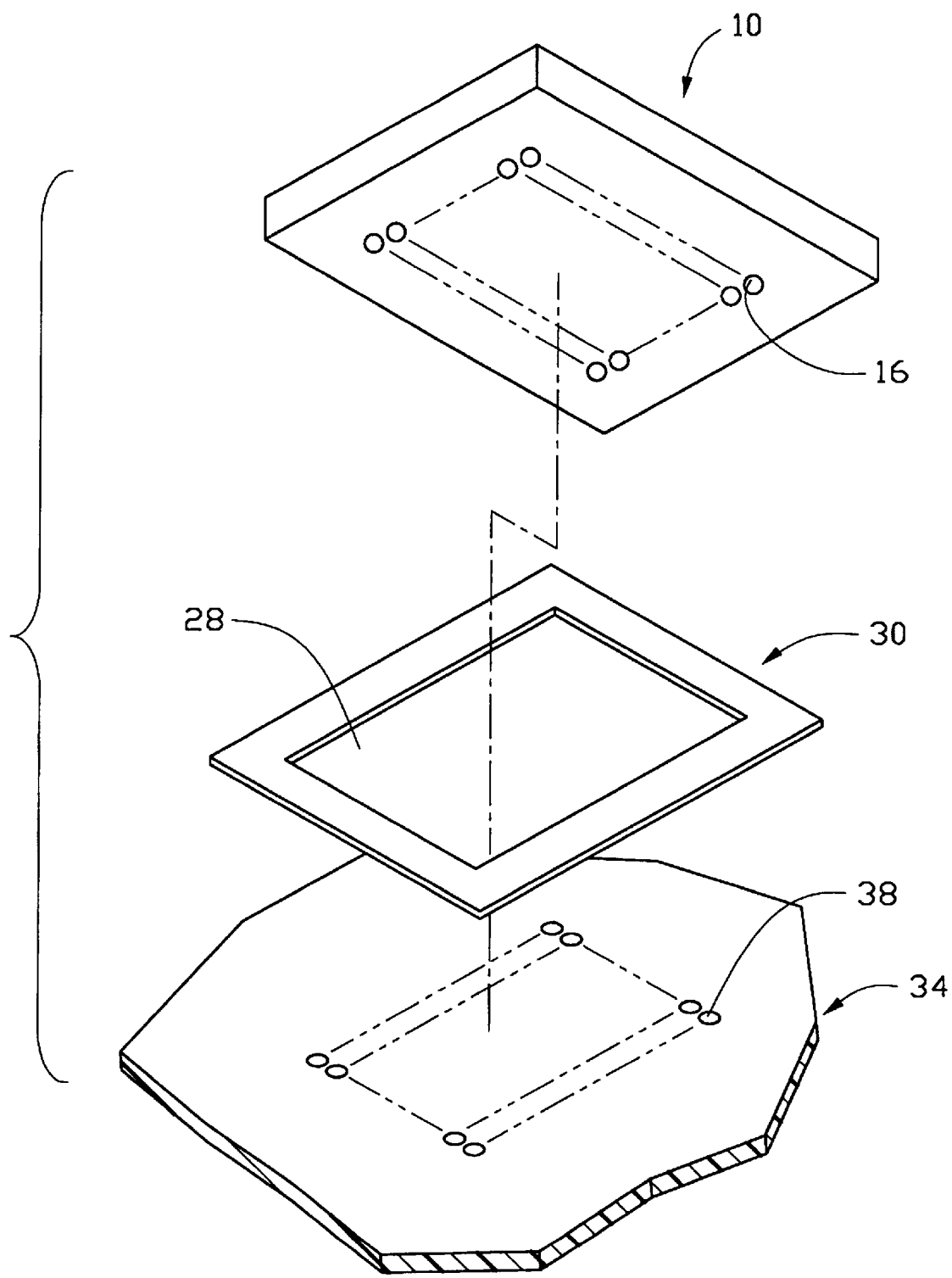
FIG. 5 is an exploded view of a third embodiment of an electrical socket in accordance with the present invention.

Referring to FIG. 5, in the third embodiment, the adjusting device is designed to be an adjusting frame 30 defining an opening 28 therein for receiving the contacts (not labeled) of the connector 10. During the heat treatment procedure, the adjusting frame 30 will melt to be adhered between the connector 10 and the circuit board 34 for accurately and firmly securing the connector 10 on the circuit board 34. Thus, the fracture stress exerted on the solder ball 16 can be absorbed by the adjusting frame 30 and the misalignment between the contacts 15 and the contact pads 38 of the circuit board 34 is effectively avoided. Other processes required in the third embodiment are substantially identical to those of the first embodiment.

Figure 6:
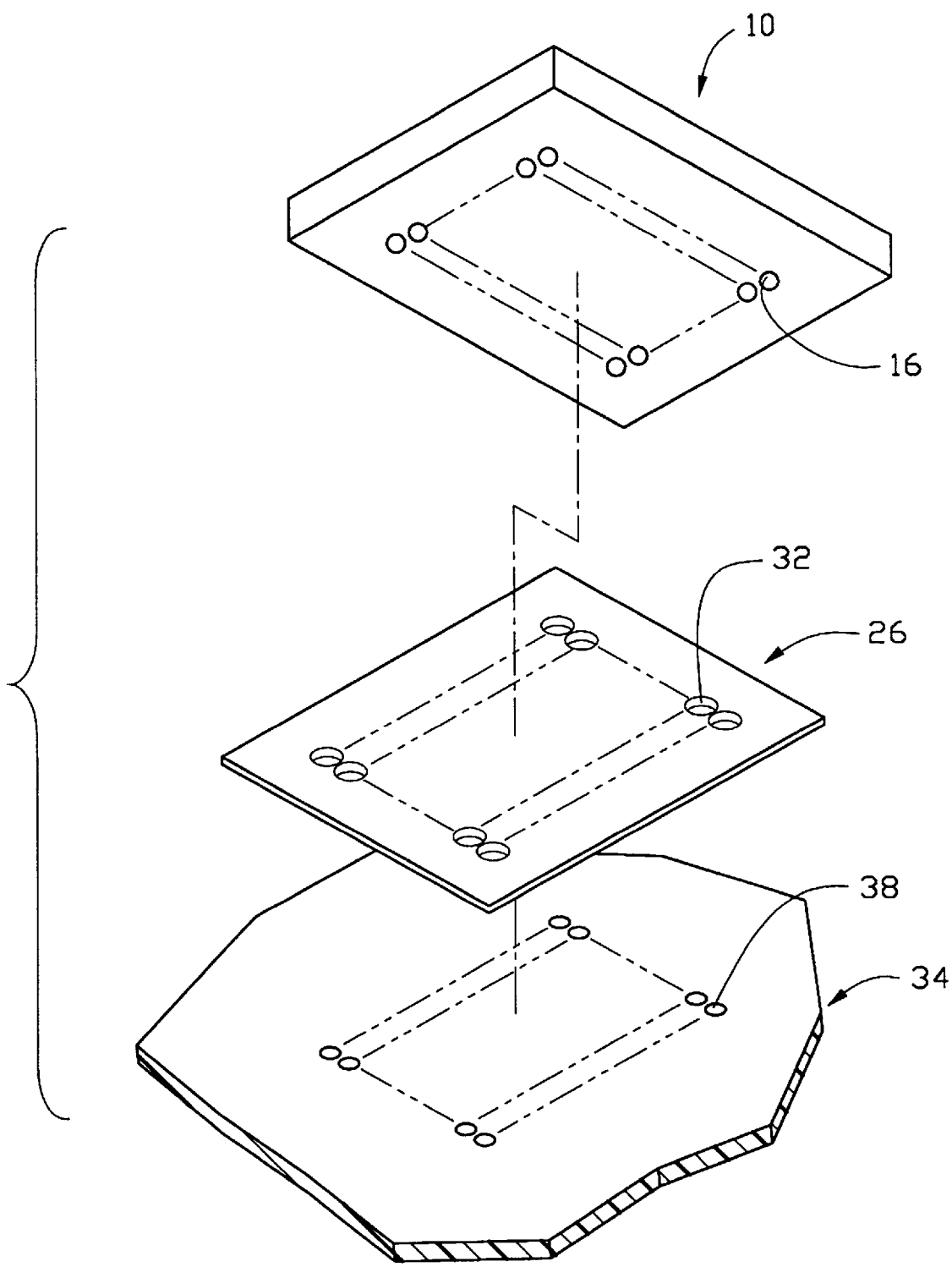
FIG. 6 is an exploded view of a fourth embodiment of an electrical socket in accordance with the present invention.

FIG. 6 illustrates a fourth embodiment wherein the adjusting device is designed to be an adjusting chip 26 defining positioning holes 32 therein corresponding to the contacts. During the heat treatment procedure, the adjusting chip 26 will melt to be adhered between the connector 10 and the circuit board 34 thereby serving the same function as the second embodiment. Other process required in the fourth embodiment are substantially identical to the first embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for mounting a ball-grid-array (BGA) electrical socket to a circuit board, said electrical socket and circuit board having different coefficients of thermal expansion (CTE), said method comprising the steps of:
   (a) manufacturing an electrical socket and a circuit board, a plurality of contacts received in the electrical socket, a plurality of contact pads formed on the circuit board corresponding to the contacts of the electrical socket, a plurality of holes defined in the electrical socket surrounding the contacts, and a plurality of positioning holes defined in the circuit board and corresponding to the holes of the electrical socket;
   (b) planting a plurality of solder balls onto the corresponding contacts of the electrical socket;
   (c) disposing a plurality of posts made of adhesive fusible material into the holes of the electrical socket and the positioning holes of the circuit board; and
   (d) subjecting the electrical socket and the circuit board to a heat treatment process to cause the solder balls of the electrical socket to be soldered to the contact pads of the circuit board and the posts to melt and then solidify to fix the electrical socket to the circuit board, said posts absorbing most of fracture stress exerted on the solder balls by the socket and the circuit board due to the different CTEs of the electrical socket and the circuit board thereby preventing misalignment between the contacts of the electrical socket and the contact pads of the circuit board.

2. The method as claimed in claim 1, wherein the posts are made of thermoplastic material.

3. An electrical socket for electrically connecting a modular chip and a circuit board, comprising:
   an insulative housing forming a mating face for connecting to the modular chip, a jointing face for connecting to the circuit board, a plurality of engaging slots and holes defined between the mating face and the jointing face, the holes being located around the edges of the housing;

a plurality of matrix type contacts received in the corresponding engaging slots and a plurality of solder balls planted on bottom ends of the contacts, the contacts being adapted to be soldered to the circuit board after undergoing a heating procedure; and a plurality of adjusting posts made of adhesive fusible material and fixed in the holes of the housing, at least a portion of each adjusting post extending outside of the housing and being adapted to be fixed to the circuit board after undergoing the heating procedure, the adjusting posts circumferentially enclosing the contacts of the electrical socket in a limited space and absorbing most of the fracture stress exerted on the solder balls by the socket and the circuit board when the socket is mounted to the circuit board and subject to a thermal load, thereby preventing misalignment between the contacts of the electrical socket and the circuit board.

4. The socket as claimed in claim 3, wherein the adjusting posts are made of a thermoplastic material.

5. A method for mounting an electrical socket to a circuit board, comprising the following steps:

preparing an adjusting device made of thermoplastic material;

preparing a circuit board having a corresponding plurality of contact pads and a positioning hole;

preparing an electrical socket having a hole and a corresponding plurality of ball-grid-array (BGA) contacts with corresponding solder balls attached thereto, bringing the adjusting device to be received in the hole of the electrical socket, and positioning the socket together with the adjusting device to the circuit board to cause the contacts of the socket to contact the pads, and the adjusting device to engage the positioning hole of the circuit board;

heating the socket together with circuit board to a temperature melting the solder balls and the adjusting device;

solidifying the adjusting device so that it fixedly connects the socket and the circuit board together whereby a large portion of fracture stress which would be exerted on the solder balls during thermal loading due to different coefficients of thermal expansion of the socket and the circuit board is absorbed by the adjusting device.

* * * * *